United States Patent [19]

Yamamoto et al.

[11] Patent Number: 4,743,525

[45] Date of Patent: May 10, 1988

[54] LITHOGRAPHIC PRINTING PLATE EXCELLENT IN PRINTING ENDURANCE

[75] Inventors: Kazuyoshi Yamamoto; Eiji Kanada; Kyonosuke Yamamoto; Satoshi Katano, all of Nagaokakyo, Japan

[73] Assignee: Mitsubishi Paper Mills, Ltd., Tokyo, Japan

[21] Appl. No.: 923,138

[22] Filed: Oct. 24, 1986

[30] Foreign Application Priority Data

Oct. 25, 1985 [JP] Japan .................................. 60-239163

[51] Int. Cl.$^4$ ................................................. G03C 5/54
[52] U.S. Cl. ...................................... 430/204; 430/227; 430/229; 430/230; 430/621; 430/642
[58] Field of Search ............... 430/204, 642, 621, 229, 430/230, 232, 233, 231, 227

[56] References Cited

U.S. PATENT DOCUMENTS

| | | | |
|---|---|---|---|
| 2,191,206 | 2/1940 | Schwartz | 430/642 |
| 4,510,228 | 4/1985 | Tsubai et al. | 430/204 |
| 4,605,609 | 8/1986 | Okazaki et al. | 430/232 |
| 4,606,985 | 8/1986 | Takaya et al. | 430/204 |

*Primary Examiner*—Richard L. Schilling
*Attorney, Agent, or Firm*—Cushman, Darby & Cushman

[57] ABSTRACT

Disclosed is a lithographic printing plate material which comprises a support and at least an undercoat layer, a silver halide emulsion layer and a catalytic layer containing physical development nuclei provided in this order on said support and which utilizes silver complex diffusion transfer process, wherein content of calcium ion in at least one of lime treated gelatin-containing layers is 1000 ppm or less.

4 Claims, No Drawings

LITHOGRAPHIC PRINTING PLATE EXCELLENT IN PRINTING ENDURANCE

BACKGROUND OF THE INVENTION

This invention relates to a lithographic printing plate material which utilizes the silver complex diffusion transfer process.

Lithographic printing plates consist of greasy ink receptive oleophilic image areas and ink unreceptive oil repellent non-image areas, the latter being generally water receptive hydrophilic areas. Therefore, the ordinary lithographic printing is carried out by feeding both water and ink to the printing plate surface to allow the image areas to receive preferentially a colored ink and the non-image areas preferentially water and then transferring the ink on the image areas onto a substrate such as paper.

Thus, in order to obtain a print of good quality, it is necessary that oleophilicity of the image areas and hydrophilicity of the non-image areas are both high enough so that when water and ink are applied, the image areas may receive sufficient amount of ink while the non-image areas completely repel the ink.

In the case of lithographic printing plate materials which utilize the silver complex diffusion transfer process (DTR process), especially those which have a nuclei layer on the surface of emulsion layer, silver salt grains which have formed latent image are reduced to black silver by development to form hydrophilic non-image areas while unexposed silver salt crystals become silver complex by silver salt solvents in a developer, which diffuse to the surface nuclei layer and bring about physical development due to the presence of the nuclei to form image areas mainly composed of ink receptive silver on the gelatino surface layer.

Since the silver layer precipitated on gelatin is used as ink receptive areas in the above lithographic printing plates, the image areas are insufficent in resistance against mechanical wear as compared with general lithographic printing plates (e.g., PS plate) and thus they show defects such as dropout of the image areas, gradual decrease of ink receptivity of the image areas, etc. An increase of hardness of gelatin or increase of amount of physical development nuclei in an attempt to overcome the above defects causes formation of scums and a sharp reduction of printing endurance. The mechanical strength of the image areas and scumming conflict with each other to provide a limitation of the endurance of the lithographic printing plates and development of new techniques to overcome this limitation has been demanded.

The inventors have conducted wide research on gelatins which serve as a direct support for image silver layer and as a result it has been found, surprisingly, that with decrease of content of calcium ion in gelatin, the mechanical strength of the image areas increases and furthermore the scum increases very little and printing endurance markedly increases.

SUMMARY OF THE INVENTION

Accordingly, it is an object of this invention to provide a lithographic printing plate material of silver complex diffusion process type which causes little scumming and provides markedly improved printing endurance.

DESCRIPTION OF THE INVENTION

The above object of this invention has basically been accomplished by providing a lithographic printing plate material which utilizes the silver complex diffusion transfer process and which comprises a support and at least an undercoat layer, a silver halide emulsion layer and a physical development nuclei-containing catalyst layer provided on said support in this order, wherein calcium ion content in at least one of lime treated gelatin-containing layers is at most 1000 ppm.

Japanese Patent Unexamined Publication (Kokai) No. 57835/85 discloses use of gelatin similar to that of this invention in an image receiving layer containing physical development nuclei, but the purpose of the use is for increasing optical density of image areas and it makes no mention of lithographic printing plates.

All of the layers of the lithographic printing plate material of this invention may be lime treated gelatin-containing layer, but preferably an undercoat layer and a silver halide emulsion layer can be a lime treated gelatin-containing layer.

The effect of this invention can be obtained by adjusting calcium ion content in all of the lime treated gelatin-containing layers to 1000 ppm or less, but can also be obtained by adjusting the calcium ion content in at least one of the layers, for example, only the undercoat layer to 1000 ppm or less.

Preferably, the raw material for the gelatin used in this invention is beef bone, more than half of which is calcium phosphate. This calcium phosphate is eluted as a soluble calcium dihydrogen phosphate with dilute hydrochloric acid to leave ossein mainly composed of insoluble collagen. The hydrochloric acid treatment for removing calcium phosphate accompanies hydrolysis of ossein and treatment for a long time results in loss of ossein. Therefore, this treatment should be carried out under conditions of providing good efficiency. The ossein is subjected to treatment with lime for a long period, then washing with water, neutralization, washing with water and then extraction of gelatin with warm water at a given pH. Of course, production of gelatin is not limited to the above method, but gelatin may be produced by such method or those similar to such method. The ordinary lime treated gelatins contain considerably high concentrations of calcium and other inorganic salts. For example, regarding calcium, the commercially available photographic gelatin contains 3,000 ppm–5,000 ppm of calcium ion.

The inventors have conducted intensive research on gelatins free of these calcium salts and other inorganic salts and as a result, it has been found that with decrease of calcium ion content in lime treated gelatin the strength of image silver of image areas becomes higher, the color tone of the image silver becomes clearer and further uneven development of the image silver and uneven coating of nuclei layer seldom occur and thus excellent properties for lithographic printing plates are obtained.

Of course, photographic gelatins include acid treated gelatin besides lime treated gelatin and when the former is used, severe scumming occurs for some reason and the effect of this invention cannot be obtained.

The action of calcium ion in lime-treated gelatin is not clear, but it is considered that calcium ion is coordinately adsorbed by the gelatin to hinder the orientation of the gelatin and to reduce the mechanical strength of the gelatin or calcium ion in the gelatin surface layer acts on physical development nuclei in the nuclei layer to reduce the activity of the nuclei. This invention should never be bound by these thoughts.

The lime treated gelatin-containing layers of lithographic printing plate material which are dealt with in this invention may be an undercoat layer and/or an emulsion layer and/or a catalytic nuclei layer. These gelatin-containing layers are usually hardened with a gelatin hardener. As the gelatin hardens, there may be used, for example, one or more of inorganic compounds such as chromium alum, aldehydes such as formaldehyde, glyoxal, malealdehyde and glutaraldehyde, aldehyde analogous compounds such as N-methylol derivatives of urea and ethyleneurea, mucochloric acid, 2,3-dihydroxy-1,4-dioxane, nitrogen-containing six-membered ring compounds having active halogen such as 2,4-dichloro-6-hydroxy-s-triazine salts and 2,4-dihydroxy-6-chloro-s-triazine salts, divinyl sulfone, divinyl ketone and M,M,M-triacryloyl hexahydrotriazine which have active vinyl group, compounds having in each molecule at least two ethyleneimino group or epoxy group which is an active three-membered ring, dialdehyde starch as a high polymer hardener and the like.

The hardener may be added to all of the layers or may be added to some of the layers or only one layer. When a diffusible hardener is used and two layers are simultaneously coated, the hardener may be added to either one of these two layers. Further, the hardener may be added at the time of preparation of the emulsion or at the time of coating the emulsion.

The gelatin in the gelatin-containing layers of this invention may be partially replaced with one or more of hydrophilic high polymers such as conventional gelatins of high calcium content, water soluble gelatin, gelatin derivatives, starch, dextrin, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer, etc. It is also possible to add one or some of vinyl polymer aqueous emulsion (latex) to the gelatin layers.

It is natural that these additives must be added to lime treated gelatin-containing layer in such an amount that calcium ion content in that layer is 1,000 ppm or less.

Amount of high polymer binder in undercoat layer is generally 0.5-10 g/m$^2$, preferably 1-6 g/m$^2$. The undercoat layer may contain pigments, dyes, carbon black, etc. for prevention of halation and may further contain solid powders of 2-10$\mu$ in average diameter for improvement of printing endurance. In addition, it may also contain photographic additives such as developing agent.

The undercoat layer may be such that disclosed in Japanese Patent Unexamined Publication (Kokai) Nos. 5503/73, 100203/73 and 16507/74.

The silver halide emulsion layer may comprises, for example, silver chloride, silver bromide, silver chlorobromide and mixture of them with silver iodide. The silver halide grains may contain heavy metals such as rhodium salts, iridium salts, palladium salts, ruthenium salts, copper salts, etc. The crystalline form of the grains has no limitation and may be monodispersed or polydispersed grains and furthermore, may be core-shell type grains or tablet grains. One of the preferred examples is a monodispersed or polydispersed grain which comprises at least 80% of silver chloride with a rhodium salt or iridium salt.

Silver halide grain may be sensitized by various methods at the time of preparation or coating. For example, silver halide grain may be chemically sensitized by well known methods such as with sodium thiosulfate or alkyl thiourea or gold compounds such as gold rhodanate and gold chloride or combination of them.

Silver halide grain may further be positively or negatively sensitized or desensitized with organic sensitizing dyes such as cyanine and hemicyanine dyes. There is no special limitation in wavelength range for which sensitization or desensitization can be effected. Therefore, silver halide grains may be orthochromatically or panchromatically sensitized or furthermore, may be sensitized for exposure with a helium-neon laser beam, argon laser beam, LED and semiconductor laser beam. Moreover, they may be desensitized for visible light and sensitized for UV light for handling under room light.

The catalytic nuclei layer provided above the emulsion layer contains physical development nuclei. As the physical development nuclei, there may be used fine particles of metals such as silver, antimony, bismuth, cadmium, cobalt, lead, nickel, palladium, rhodium, gold, platinum, iron, etc., sulfides, polysulfides or selenide of these metals or mixtures or mixed crystals thereof.

The catalytic nuclei layer may or may not contain hydrophilic binder and if the layer contains it, examples thereof are hydrophilic high polymers such as gelatin, starch, carboxymethyl cellulose, gum arabic, sodium alginate, hydroxyethyl cellulose, polystyrenesulfonic acid, vinylimidazole-acrylamide copolymer, polyvinyl alcohol, etc. or oligomers thereof.

The catalytic nuclei layer may further contain one or some of developing agents such as hydroquinone, methyl hydroquinone, catechol or the like or known hardeners such as formaldehyde, succinaldehyde or the like.

Each of the coating layers such as an undercoat layer, silver halide emulsion layer, catalytic nuclei layer, etc. may contain some of anionic, cationic or neutral surface active agents as a coating aid and furthermore a thickening agent or an antistatic agent.

Support for the lithographic printing plates of this invention may comprise any of the materials which can withstand lithographic printing such as paper, synthetic or semisynthetic high polymer films, metallic sheets such as of aluminum, iron, etc. One or both surfaces of the support may be coated with one or more layers of high polymer films or metallic thin films. The surface of the support may be surface treated to improve adhesion to the coating layer. Especially suitable supports are paper or polyester film coated with a polyolefin on one or both surfaces, polyester film subjected to surface hydrophilizing treatment, aluminum sheet subjected to surface treatment, etc.

These supports may contain pigments for preventing halation or solid fine particles for improving surface properties. Further, they may be light transmissible for back shoot.

The processing solution for development used in this invention may contain alkaline materials such as sodium hydroxide, potassium hydroxide, lithium hydroxide or tribasic sodium phosphate; preservatives such as a sulfite; silver halide solvents such as thiosulfate, thiocyanate, cyclic imide, thiosalicylic acid or amine; thickening agents such as hydroxyethyl cellulose, carboxymethyl cellulose; antifoggants such as potassium bromide, 1-phenyl-3-pyrazolidone; development modifiers such as polyoxyalkylene compound, onium compound, etc.

Furthermore, as the processing solution there may be also used a second solution containing compounds which neutralize the alkalinity and further improve ink receptivity of the surface silver layer.

The surface silver layer formed by development of the lithographic printing plate material made by this invention may be rendered ink receptive or increased in ink receptivity by optional known surface treating agents. Such treating agents are disclosed, for example, in Japanese Patent Examined Publication (Kokoku) No. 29723/73 and U.S. Pat. No. 3,721,559.

Known printing methods and etch solutions, damping solutions, etc. may be used for carrying out this invention.

The following non-limiting examples further illustrate this invention.

EXAMPLE 1

A matting layer containing silica particles of 5μ in average particle size was provided on one surface of a both-surface polyethylene coated paper of 135 g/m². On another surface which had been subjected to corona discharge treatment, were coated an undercoat layer containing carbon black and silica particles of 7μ in average particle size (gelatin content in this layer was 0.5 g/m²) and an orthochromatically sensitized high-speed silver chloride emulsion layer (gelatin content 0.8 g/m²) on said undercoat layer at 1.0 g/m² in terms of silver nitrate by a two-layer simultaneous coating technique with an extrusion coater. As a hardener, 2,4-dichloro-6-hydroxy-s-triazine sodium salt was added to the undercoat layer and the emulsion layer at 40 mg/g gelatin in line with coating of the layers. After drying, these layers were heated at 40° C. for 5 days and then overcoated with a nuclei composition mentioned in EXAMPLE 2 of Japanese Patent Unexamined Publication (Kokai) No. 21602/83 (which contained copolymer No. 3 of acrylamide and imidazole as a polymer and 0.8 g/m² of hydroquinone as a developing agent) by a dip coater followed by drying to make a lithographic printing plate material.

Comparative Sample A was made by using lime treated gelatin containing 3000 ppm of calcium ion as the gelatin used in the undercoat layer and the emulsion layer of the lithographic printing plate material obtained hereabove.

Comparative Sample B was made by using lime treated gelatin containing 2000 ppm of calcium ion as the gelatin used in the undercoat layer and the emulsion layer of the above lithographic printing plate material.

Samples of this invention were made by using lime treated gelatins containing 0–1000 ppm of calcium ion as the gelatin used in the undercoat layer and the emulsion layer of the above-obtained lithographic printing plate material.

Thus obtained lithographic printing plate materials were exposed imagewise by a process camera having an image reversing mechanism and then subjected to development treatment with the following silver complex diffusion transfer developer at 30° C. for one minute.

| Transfer developer | |
|---|---|
| Water | 700 ml |
| Potassium hydroxide | 20 g |
| Anhydrous sodium thiosulfite | 50 g |
| 2-Mercaptobenzoic acid | 1.5 g |
| 2-Methylaminoethanol | 15 g |
| Water was added to make up one l. | |

After development, these plates were passed between two squeeze rollers to remove excess developer, immediately thereafter treated with a neutralizing solution of the following composition at 25° C. for 20 seconds, passed between squeeze rollers to remove excess solution and dried at room temperature.

| Neutralizing solution | |
|---|---|
| Water | 600 ml |
| Citric acid | 10 g |
| Sodium citrate | 35 g |
| Colloidal silica (20% liquid) | 5 ml |
| Ethylene glycol | 5 ml |
| Water was added to make one l. | |

Thus obtained lithographic printing plates were mounted on an offset printing machine, the following etch solution was applied allover the surface of the plates and printing was carried out using the following damping solution.

| Etch solution | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Damping solution | |
| o-Phosphoric acid | 10 g |
| Nickel nitrate | 5 g |
| Sodium sulfite | 5 g |
| Ethylene glycol | 100 g |
| Colloidal silica (20% liquid) | 28 g |
| Water was added to make 2 l. | |

A.B. Dick 350CD (Trade mark for offset printing machine of A.B. Dick Co.) was used as the printing machine.

Evaluation of the printing plates was conducted on the basis of the number of printed copies obtained before the printing plate became impossible to use due to scumming of non-image areas and loss of images caused by dropout of silver images and in accordance with the following standard.

⊚ More than 20,000 copies
○ 10,000–20,000 copies
Δ 5,000–10,000 copies
x 2,000–5,000 copies The results are shown in Table 1.

TABLE 1

| Printing plates | Ca content | Density of silver image | Loss of image | Scumming |
|---|---|---|---|---|
| Comparative Sample A | 3,000 | 0.65 | | Δ |
| Comparative Sample B | 2,000 | 0.63 | | |
| Sample of this invention | 0 | 0.55 | | |
| Sample of this invention | 100 | 0.56 | | |
| Sample of | 500 | 0.58 | | |

TABLE 1-continued

| Printing plates | Ca content | Density of silver image | Loss of image | Scumming |
|---|---|---|---|---|
| this invention | | | | |
| Sample of this invention | 1000 | 0.60 | | |

The Ca content is expressed by concentration of calcium ion (ppm).

EXAMPLE 2

Lithographic printing plate materials were made in the same manner as in EXAMPLE 1 except that lime treated gelatin containing 3,000 ppm of calcium ion was used in the emulsion layer and in the undercoat layer for Comparative Sample C; and the same lime treated gelatin as above was used in the emulsion layer and lime treated gelatins containing 0–1,000 ppm of calcium ion were used in the undercoat layer for samples of this invention and that 2,4-dichloro-6-hydroxy-s-triazine sodium salt as a hardener was added to only the undercoat layer at 45 mg/g gelatin in line with coating of the layers. These lithographic printing plate materials were exposed and treated in the same manner as in EXAMPLE 1 and evaluated also in the same manner as in EXAMPLE 1.

The results are shown in Table 2.

TABLE 2

| Printing plates | Ca content | Density of silver image | Loss of image | Scumming |
|---|---|---|---|---|
| Comparative Sample C | 3000 | 0.67 | Δ | |
| Sample of this invention | 0 | 0.57 | | |
| Sample of this invention | 100 | 0.58 | | |
| Sample of this invention | 500 | 0.60 | | |
| Sample of this invention | 1000 | 0.62 | | |

The Ca content is expressed by concentration of calcium ion (ppm).

EXAMPLE 3

Lithographic printing plate materials of Comparative Sample D and E and of this invention were made in the same manner as in EXAMPLE 1 except that a silver chloride emulsion containing an iridium salt and sensitized for exposure with helium-neon laser beam was used in the emulsion layer and as a hardener 50 mg/g gelatin of formaldehyde was used in the undercoat layer and the emulsion layer, respectively. These were exposed imagewise by Linotype linotric 300, a flat bed type scanning type-setter using helium-neon laser. Development and subsequent treatments and evaluation were conducted in the same manner as in EXAMPLE 1. The results are shown in Table 3.

TABLE 3

| Printing plates | Ca content | Density of silver image | Loss of image | Scumming |
|---|---|---|---|---|
| Comparative Sample | 3000 | 0.68 | x | |
| Comparative Sample | 2000 | 0.67 | Δ | |
| Sample of this invention | 0 | 0.64 | | |
| Sample of this invention | 100 | 0.64 | | |
| Sample of this invention | 500 | 0.65 | | |
| Sample of this invention | 1000 | 0.66 | | |

The Ca content is expressed by concentration of calcium ion (ppm).

What is claimed is:

1. A lithographic printing plate material which comprises
   a support;
   at least an undercoat layer, a silver halide emulsion layer and a catalytic layer containing physical development nuclei provided in this order on said support and which utilizes silver complex diffusion transfer process; and
   at least one of the undercoat layer and the silver halide emulsion layer contains lime treated gelatin in which the concentration of calcium ions is 1000 ppm or less.

2. A lithographic printing plate material according to claim 1 wherein at least one of the lime treated gelatin-containing layers contain a hardener.

3. A method of lithographic printing plate making which comprises imagewise exposing the lithographic printing plate material of claim 1 and developing the exposed material with a diffusion transfer developer.

4. A method of printing which comprises mounting the lithographic printing plate made by the method of claim 3 and carrying out printing.

* * * * *